United States Patent
Inoue et al.

(10) Patent No.: US 8,959,462 B2
(45) Date of Patent: Feb. 17, 2015

(54) MASK DESIGN METHOD, PROGRAM, AND MASK DESIGN SYSTEM

(71) Applicant: International Business Machines Corporation, Armonk, NY (US)

(72) Inventors: Tadanobu Inoue, Kanagawa (JP); David O Melville, New York, NY (US); Alan E Rosenbluth, Yorktown Heights, NY (US); Masaharu Sakamoto, Kanagawa (JP); Kehan Tian, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/795,513

(22) Filed: Mar. 12, 2013

(65) Prior Publication Data

US 2013/0263063 A1 Oct. 3, 2013

(30) Foreign Application Priority Data

Apr. 3, 2012 (JP) ................................. 2012-084657

(51) Int. Cl.
*G06F 17/50* (2006.01)
*G03F 1/70* (2012.01)

(52) U.S. Cl.
CPC ........................................ *G03F 1/70* (2013.01)
USPC .......................................................... 716/54

(58) Field of Classification Search
CPC ....... G03F 7/705; G03F 1/70; G03F 7/70616; G03F 7/70625
See application file for complete search history.

(56) References Cited

U.S. PATENT DOCUMENTS

| | | | | |
|---|---|---|---|---|
| 5,725,969 | A | * | 3/1998 | Lee ................................... 430/5 |
| 2005/0015233 | A1 | * | 1/2005 | Gordon ........................... 703/13 |
| 2011/0231803 | A1 | * | 9/2011 | Inoue et al. ..................... 716/50 |

FOREIGN PATENT DOCUMENTS

| | | |
|---|---|---|
| JP | 08-254816 | 1/1996 |
| JP | 2001-013668 | 1/2001 |
| JP | 2004-191621 | 1/2004 |
| JP | 2004-279997 | 10/2004 |
| JP | 2009-251518 | 10/2009 |
| JP | 2011-076146 | 4/2011 |
| JP | 2011-137901 | 7/2011 |
| JP | 2011-186457 | 9/2011 |

\* cited by examiner

*Primary Examiner* — Thuan Do
*Assistant Examiner* — Aric Lin
(74) *Attorney, Agent, or Firm* — Cantor Colburn LLP (57) ABSTRACT

A method, an article of manufacture, and a system for designing a mask. The method for designing a mask is implemented by a computer device having a memory, a processor device communicatively coupled to the memory, and a module configured to carry out the method including the steps of: generating an optical domain representation from a design pattern and an imaging light; and optimizing the optical domain representation under a constraint that values of negative excursions at predetermined evaluation points must be greater than or equal to predetermined negative threshold values assigned to the predetermined evaluation points; where: the optical domain representation is a variable representation of a wavefront; the imaging light is light that is transmitted through the mask; the negative excursions are in an object domain representation of the optical domain representation; and the predetermined evaluation points are in the object domain representation.

20 Claims, 8 Drawing Sheets

Mask blank threshold = 0;

Mask blank threshold = -0.15;

FIG. 10

MASK DESIGN METHOD, PROGRAM, AND MASK DESIGN SYSTEM

CROSS-REFERENCE TO RELATED APPLICATION

This application claims priority under 35 U.S.C. §119 from Japan Patent Application No. 2012-084657 filed Apr. 3, 2012, the entire contents of which are incorporated herein by reference.

BACKGROUND OF THE INVENTION

1. Field of the Invention

The present invention relates to a mask design technology and more particularly relates to a mask design method, a program therefore, and a mask design system.

2. Description of Related Art

The entire contents of US Patent applications identified by Ser. Nos. 12/334,482, 12/334,488 each filed on Dec. 14, 2008; Ser. No. 12/334,485 filed on Dec. 14, 2008; and the entire contents of U.S. Pat. No. 8,108,802 issued on Jan. 31, 2012; and of U.S. Pat. No. 7,057,709 issued on Jun. 6, 2006; may be incorporated herein as references.

Minimum printed feature sizes in semiconductor devices become finer due to continuous requirements for ever higher performance and faster operation of the devices while reducing space consumption of information processing apparatuses. Thus, the minimum feature size of state of the art semiconductor devices almost reaches to about 22 nm or less. Masks having patterns of structures for semiconductor devices may be used for photolithography of layers included in semiconductor devices. Patterns for forming a semiconductor device are provided by the mask so as to expose the patterns of the mask to an adequate photo-imaging technology, including immersion exposure technologies.

As feature sizes become finer and finer, the patterns formed in the mask may become designed by several techniques. For example, Optical Proximity Correction (OPC) technology, rule-based topology modification and model-based topology modification, and so-called inverse lithography technology (ILT); hereafter, the ILT technologies are simply referred to as ILT and as Source Mask Optimization (SMO) technology. The terms ILT and SMO are regarded here as interchangeable, and either term can be employed regardless of whether the source is optimized along with the mask.

Since OPC uses polygon domain and counter-biases the mask iteratively, it does not allow the modification of topology during optimization. Polygon domain, also referred to as spatial domain, refers to a mask representation based on polygons that have approximately the same shape as the apertures in the mask blank film. They are fabricated in a manufactured mask, with the location of the polygon edges serving as variables that define the mask. The polygon apertures typically have a transmission of 1, and the mask regions surrounding the polygons have the same transmission as the mask blank film.

In the common case of so-called binary masks, the mask blank transmission is approximately 0. In some cases the mask blank may have a transmission other than 0, and the transmission may be phase-shifted relative to the polygon transmission. So-called tri-tone masks may contain two kinds of aperture, each having a different transmission value. But in general, OPC adjusts the edge locations within each polygon to counter-bias the distortions in printed pattern edges, and it does so without changing the topology of the mask polygons. Polygon domain ILT or SMO uses optimization to determine the positions of the mask polygon edges, but during polygon domain optimization these techniques again leave the polygon topology unchanged.

The fixed topology limits optimization performance. The rule-based topology modification technology becomes less effective in the fabrication of state of the art semiconductor devices and human intuition may not provide an acceptable solution for the mask pattern. The ILT or SMO therefore often uses spatial frequency or transmission frequency analysis in the initial optimization of the optical domain.

Optical domain refers to a mask representation in which the mask variables essentially represent the amplitude of the light that transmits through the mask. The amplitudes used by ILT or SMO may be taken in a plane immediately past the mask, in which case they essentially represent the transmission of the mask, or they may be taken in the pupil of the projection lens, which collects the transmitted light and images it onto the semiconductor device substrate. Photolithographic lenses are almost always telecentric, in which case the pupil is planar, and for convenience the pupil is referred to as the pupil plane in the general case. The plane adjacent to the mask through which light exits is the object plane. The pupil plane amplitudes are related to the object plane amplitudes by Fourier-transformation in the usual case of scalar mask variables.

Likewise, the band-limited portion of the object plane amplitudes will be the inverse Fourier-transform (iFT) of the collected pupil amplitudes, and in some forms of SMO the optical variables only include light components that are captured by the projection lens. It should be noted that this collection process by the lens constitutes a band-limiting or filtering process. Those skilled in the art will recognize that it is also possible to use a convention in which the roles of the transform and inverse transform are reversed, but for simplicity such a convention will not be considered in the discussion below.

To distinguish these Fourier-transformations in the physical space of a lens system from the temporal Fourier-transformations that are commonly used in other electrical engineering contexts, the optical variables in ILT and SMO are conventionally said to comprise spatial frequencies. An optimization of the optical variables is sometimes referred to as an optimization in the spatial frequency domain, often referred to more briefly as a frequency domain optimization. The term frequency domain is sometimes employed in SMO regardless of whether the light amplitudes are measured in the pupil plane or the object plane, but this usage is not universal.

Likewise, the term spatial domain is sometimes used in SMO to refer to optimization of the polygonal shapes of mask apertures, though again this usage is not universal. In most of this document the terms frequency domain and spatial domain will be avoided since their usage varies in the literature. However, the acronyms FDJO and SDJO will be retained, as abbreviations that refer to joint optimization of mask variables and source variables, with the mask variables being defined in the optical domain for FDJO, and in the polygon domain for SDJO.

During an ILT or SMO flow, an optimizer may be used to control the gridded amplitude of the light transmitted through the mask. The mask optical variables in ILT may be the transmissions of the grid boxes, i.e. pixels, or they may be the values of the transmitted optical field at the points of a sampling grid. This light is optimized in the optical domain, and so can be referred to in SMO as a frequency domain optimization. In SMO it is common practice to only include optical variables that represent light which is captured by the projection lens, but when variables in the object plane are used they will generally include at least some light components that the lens cannot capture.

For clarity, any optimization involving optical variables will be referred to here as an optical domain optimization, regardless of whether this light includes components that are not collected by the lens. Further, the optical domain optimization can be referred to here as pupil domain when the optical variables are defined as the pupil amplitudes, and can be referred to here as object domain when the optical variables are defined at the mask exit. When mask polygons are optimized instead of optical variables, which in some conventions can be regarded as a spatial domain optimization, the term polygon domain optimization will be used.

Figure 10:
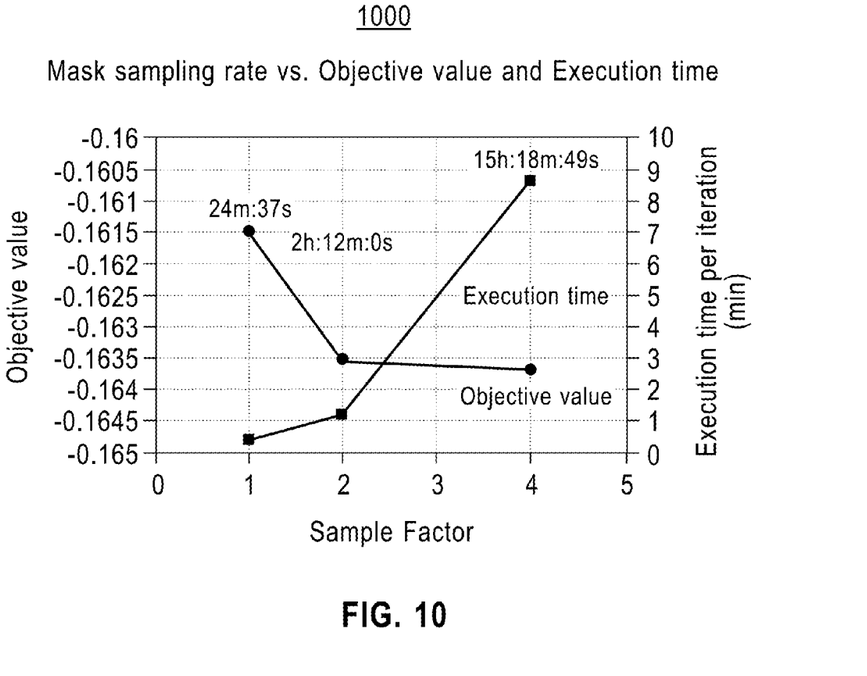
FIG. 10 shows the plot of computation time and objective values in conventional ILT technology.

The ILT technologies can contribute design manufacturability of the optical mask in the state of the art implementations; however, the ILT has some defects in the optimization of mask topology. FIG. 10 shows a plot of computation time and objective values of ruling (both in arbitrary units) and mask sampling rates (in arbitrary unit); the left hand ordinate represents the objective value; the right hand ordinate represents the computation time; the abscissa represents the sampling rate of the mask pixels.

Referring to FIG. 10, the ILT improves the objective value as the sampling rates of the pixels increase; however, the computation time for obtaining the corresponding objective values increases in a worse than linear relation with respect to the sampling rate, while the improvement in the objective value slows down in a likewise worse than linear relation to that of the computation time as well as to total runtime.

When object domain sampling is made at points on a coarse grid, corresponding to a low sampling rate, the solution cannot achieve the sharp edges that are needed to produce patterned images of the highest possible contrast. In the particular case where the coarsely spaced mask variables take the form of finite pixels within a coarse gridding, it does become possible for the mask edges to become sharply defined; however in this case the sharp mask edges occurring at the boundaries of coarsely sized pixels will usually not be accurately positioned at the location where sharp mask edges are needed, or, more precisely, when sharp edges occur at the boundaries of coarsely sized pixels they will usually not produce image edges at exactly the right locations.

Further, it is common practice in the prior art to bring the finished optical domain solution closer to manufacturability by rounding its transmission values to the levels supported by the mask technology, such as 0 and 1 for so-called binary masks. When such a rounding post-processing is employed in ILT, it is common to add terms to the objective that promote pixel transmission values which come close to the supported values during the optimization. However, it is also important that the transmission of small assisting features remain too dim to print, while at the same time remaining bright enough to provide optical benefit, for example by improving the stability of the image in the face of focus fluctuations.

Unfortunately, when coarse pixels of intermediate transmission are rounded during post-processing, they can either be raised in transmission to a level that prints as an artifact, or they can be rounded down to the transmission level of the mask blank background, eliminating their optical benefit. It becomes possible for assisting features to avoid this problem if very finely spaced pixels are used, in that the pixels can have a width that is much narrower than the lens resolution, along with a high peak transmission that survives rounding, so that the lens reduces their intensity below the print threshold when blurring out their image to a width comparable to the lens resolution. For these reasons, fine spacing during optical domain optimization can allow high quality mask solutions to be obtained, as shown in FIG. 11. However, the number of variables increases quadratically as the variable spacing decreases, and computation speed generally degrades at least linearly with the number of variables, and usually degrades more rapidly than linearly. Therefore, the conventional ILT can not provide a scalability of designing the mask for the state of the art predetermined objective value and requires increasing computation performance with respect to the objective values of the ruling.

Different mask design techniques are disclosed in JPA 2010-140020 and JPA 2010-140021 based on selection of edge pairs including the conventional nonlinear problem solver which evaluates manufacturability of the mask.

As described above, an object of the present invention is to provide a novel mask design technology which enables scalability of topology computation while reducing computation time and hardware resources.

Another object of the present invention is to provide a novel mask design technology which allows modification of mask topology within acceptable ranges during the optimization cycles.

Another object of the present invention is to provide a mask design method, a program therefore, and a mask design system which ensure the scalability of the topology computation by allowing modification of mask topology within acceptable ranges during the optimization cycles while reducing the computation time and hardware resources.

SUMMARY OF THE INVENTION

The present invention provides a method, for designing a mask, implemented by a computer device having a memory, a processor device communicatively coupled to the memory, and a module configured to carry out the method comprising the steps of: generating an optical domain representation from a design pattern and an imaging light; and optimizing the optical domain representation under a constraint that values of negative excursions at predetermined evaluation points must be greater than or equal to predetermined negative threshold values assigned to the predetermined evaluation points; where: the optical domain representation is a variable representation of a wavefront; the imaging light is light that is transmitted through the mask; the negative excursions are in an object domain representation of the optical domain representation; and the predetermined evaluation points are in the object domain representation.

The present invention also provides a non-transitory article of manufacture tangibly embodying computer readable instructions, which when implemented, cause a computer device to carry out a method for designing a mask, the method includes the steps of: generating an optical domain representation from a design pattern and an imaging light; and optimizing the optical domain representation under a constraint that values of negative excursions at predetermined evaluation points be greater than or equal to predetermined negative threshold values assigned to the predetermined evaluation points; where: the optical domain representation is a variable representation of a wavefront; the imaging light is light that is transmitted through the mask; the negative excursions are in an object domain representation of the optical domain representation; and the predetermined evaluation points are in the object domain representation.

The present invention further provides a system for designing a mask, including: a memory; a processor device communicatively coupled to the memory; a module for designing the mask, communicatively coupled to the memory and the processor device; a generator for generating an optical domain representation of a wavefront from a design pattern and an imaging light; an optimizer for optimizing the optical domain representation under a constraint that values of negative excursions at predetermined evaluation points be greater than or equal to predetermined negative threshold values assigned to the predetermined evaluation points; where: the optical domain representation is a variable representation of a wavefront; the imaging light is light that is transmitted through the mask; the negative excursions are in an object domain representation of the optical domain representation; and the predetermined evaluation points are in the object domain representation.

DETAILED DESCRIPTION OF THE PREFERRED EMBODIMENTS

The present invention will be described based on preferred embodiments using drawings; however, the preferred embodiments are described for the purpose of description of the invention and the present invention should not be limited to the described embodiments.

The present invention uses optical domain masks as variables during the SMO process optimization; however, the mask topology in the pupil domain is converted to the polygon domain expression at the later wavefront engineering step eventually in order to apply further improved mask optimization. In the optical domain, wavefronts are optimized according to SMO (Source Mask Optimization) technique, in a preferred embodiment.

In general, the invention includes a step in which a set of optical domain variables is generated to represent the mask wavefront during optimization, and these variables can be located in the object domain or in the pupil domain. In some embodiments, the present invention uses object domain variables during the optical optimization, meaning that the optimization variables define the wavefront that is immediately transmitted through the mask, for example either as point samples on a grid, or as a gridded set of pixel transmissions.

These embodiments can employ grid spacings that are set very close to the Nyquist separation as defined by the collection band-limit of lens and source. The Nyquist separation is more specifically one half the reciprocal of the optical band-limit. However, it also possible to employ grid spacings that are much finer than the Nyquist spacing.

When object domain optical variables are used, the variable values can be Fourier-transformed to obtain the pupil plane amplitudes, and the set of pupil domain amplitudes which diffract within the collection band-limit of the lens then constitutes the band-limited pupil domain amplitude produced by the mask. In other embodiments, the present invention uses pupil domain variables during the optical optimization, meaning that the collected diffraction orders are directly optimized as variables. In such embodiments the variable values constitute the band-limited pupil domain amplitude produced by the mask. In general, regardless of whether object domain or pupil domain variables are used, the band-limited pupil domain amplitude can be inverse Fourier-transformed to provide the band-limited component of the optical amplitude in the object domain. If the band-limited component of the optical amplitude is measured in the object plane it will not include light components that the lens cannot capture. However, some embodiments of the invention directly use the full object domain amplitude as variables, and this full amplitude will generally include components which the lens cannot capture.

According to the present invention, at least a portion of the optical amplitude in the object domain is allowed to have expanded negative excursion near features of the mask while the conventional optimization requires that the optical domain masks comply with an actual mask blank exactly. In preferred embodiments of the invention, it is more specifically the band-limited component of the optical amplitude in the object domain that is allowed to have expanded negative excursion near features of the mask, and more particularly in dark regions near printing features of the mask. In other embodiments of the invention, the component of the object domain amplitude to which negative excursion constraints are applied is the full object domain amplitude rather than only the band-limited component. In either case, the locations in the object domain at which these constraints allow the optical amplitude to have expanded negative excursion are preferably located in dark regions near printing features of the mask.

The present invention accepts the negative excursion in the object domain, i.e., negative margins can be allowed in the object domain during the wavefront optimization cycles. Amounts of the negative excursions can be controlled with respect to distances from feature edges of the mask so that occurrence of the negative excursions and the feature edges can be mutually correlated. The allowance of the negative excursions associated to the feature of the mask makes it possible to reduce the number of wavefront variables to be taken into account in the optimization by filtering an effective pupil parameter such that computing overheads and the computing scalability can be improved while maintaining quality of a high resolution binary mask formed by the SMO technology.

Figure 1:
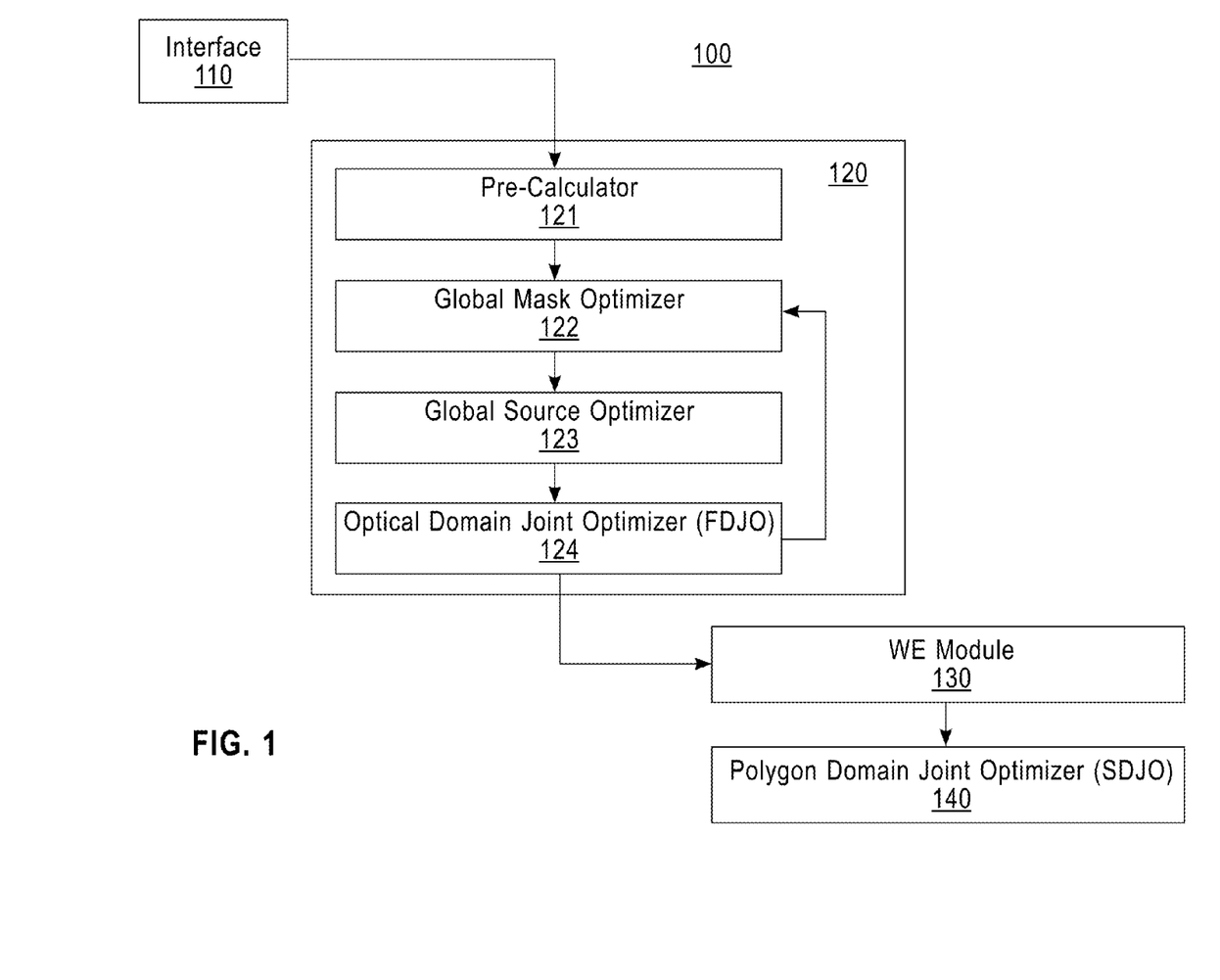
FIG. 1 shows a schematic block diagram of the present mask design system.
Figure 2A:
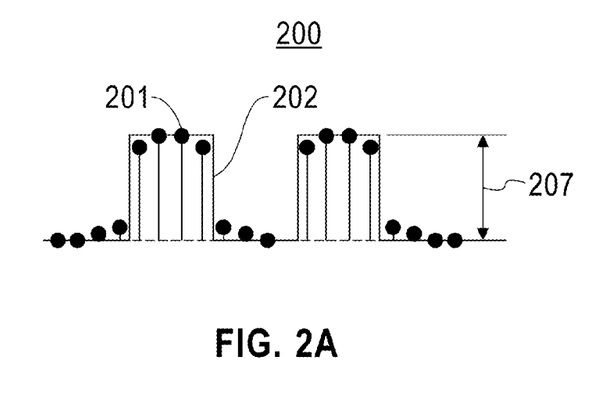
FIG. 2 shows the schematic data processing of the optimizer with referring to the conventional process.
Figure 2B:
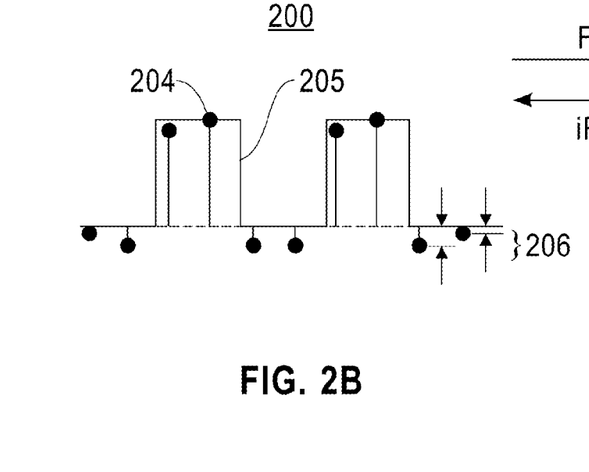
Figure 2C:
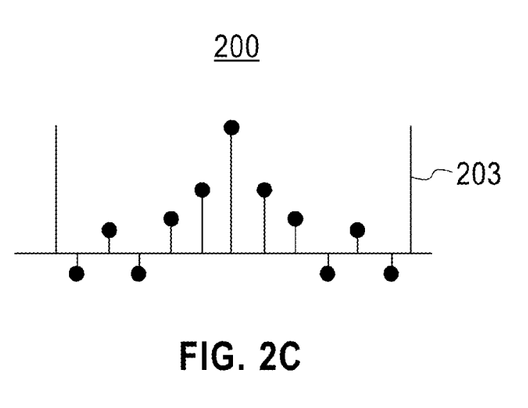
Figure 2D:
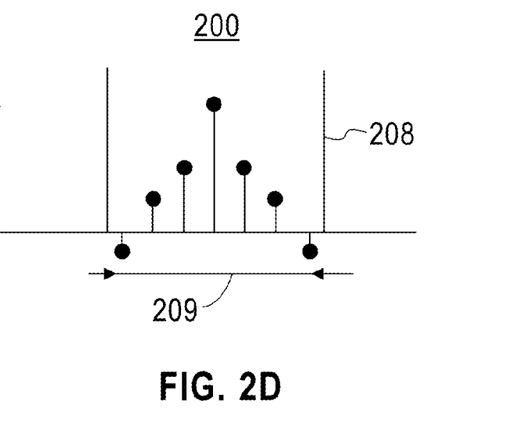

Referring to FIG. 1 a schematic block diagram of the present mask design system 100 is shown. The system can be implemented in an adequate computer system such as a personal computer, a work station, a server computer or a main frame system which is implemented with a CPU, a main memory, a ROM, a hard disk drive etc. for executing the program of the present invention. As for non-limiting examples, the CPU can be selected from any known CPUs such as PENTIUM (trademark), CORE-i (trademark) series, XEON (trademark) or compatible CPUs and the CPU can be implemented as a single or a multi-core architecture.

The CPU executes the program of the present invention to provide the functional means on the mask design system 100. Hereafter, the mask design system of the present invention is referred simply to the system 100 for simplification of the description. The system 100 comprises an interface 110, an optimizer 120, a WE module 130, and a polygon domain joint optimizer 140. The interface 110 receives design policies such as a target mask design and/or photolithography conditions such as ruling sizes and/or an exposure wavelength etc. The interface 110 can be a graphical user interface which allows interactive input of the design policies or a hardware interface which receives the design policies from an external apparatus or a network such as Ethernet (trademark).

The optimizer 120 executes the optimization of patterns to be formed on a mask blank for providing pattered exposure to layers on a semiconductor substrate. The results of the optimizer 120 are outputted to WE module 130 to express the results of the optimizer 120 as a transparency modulated mask. Masks to which the present invention can be applied include a phase shift mask and a simple [0,1] mask in which only two different mask transmission values are supported.

The optimizer 120 comprises the pre-calculator 121, the global mask optimizer 122, and the global source optimizer 123. The pre-calculator 121 generates numerical representations of the photolithography system and generates imaging matrices suitably used for Fourier-transformation. The global mask optimizer 122 can execute the optimization of the mask features within the exposure range using at least one quadratic program with constraints by representing a mask region with discrete points, and can more particularly optimize the mask using a quadratic program including a single relaxed quadratic constraint, followed by a quadratic program including a plurality of quadratic constraints. The global source optimizer 123 executes the optimization of a light pattern of the source to provide designed and patterned exposure to the mask under the phase shift mask technology using a linear program or a mixed integer linear program.

The optimizer 120 further comprises the optical domain joint optimizer 124 which executes optical domain optimization; the optical domain joint optimizer 124 is referred hereafter as FDJO 124 for simplifying the description. The FDJO 124 generally executes a local nonlinear program of the mask and the source to optimize the feature of the source and the mask in the optical domain. As will be clear to those skilled in the art, optimizer 120 can optionally employ optical domain joint optimizer 124 without using global mask optimizer 122, and can, as another option, avoid using global source optimizer 123. When global source optimizer 123 is dispensed with, the source variables in joint optimizer 124 can be initialized with values for a typical or previously used source. When global mask optimizer 124 is dispensed with, the mask variables in joint optimizer 124 can be initialized using the design shapes. It should also be noted that even though the invention jointly optimizes the source variables with the mask variables in a preferred embodiment, it is possible to use the object domain negative excursion limits of the invention while fixing the source variables during the FDJO 124 optimization. For simplicity the terms "joint optimization" and "FDJO" will be used regardless of whether the source variables are fixed. It will also be clear to those skilled in the art that the invention can be used when SMO is applied to exposure processes that use multiple masks. More particularly, it is known in the art that SMO optimization variables can be defined to reside on more than one mask, and it will be clear that the invention can be used with each mask when this is done. For simplicity the singular form will be used for terms like "mask wavefront", even though wavefronts from more than one mask can be employed.

The FDJO 124 executes Fourier-transformation for the input mask to generate an initial pupil domain expression of the wavefront. The FDJO 124 uses pupil domain mask as variables during the optimization, in this preferred embodiment. At the same time, the FDJO 124 calculates the band-limited object domain mask transmission by inverse Fourier-transformation. Herein the term "wavefront" refers to the light patterns in the object or pupil domains that are transmitted through the mask from any source point; the term "pupil domain expression" refers to the spatial frequency pattern of the wavefront after Fourier-transformation. The term "target design" refers to the design pattern on the target wafer to be designed by the present invention. It should be noted that in some embodiments the target can be specified as a range of allowable pattern sizes, rather than as a rigidly prescribed set of shapes. The terms "target design" and "design pattern" are both used herein to refer to either of these options.

According to the present invention, FDJO 124 determines the completion of the optimization in the optical domain under constraints imposed at multiple evaluation points that the negative excursion in the object domain after iFT not become smaller than the predetermined negative thresholds, i.e., $t_{dp}$ and $t_{di}$; the threshold values are determined with respect to distances from the center of the local targeted design. In addition, to reduce computational overhead while not producing degradation in the resolution, the FDJO 124 limits the number of frequency components in the pupil that serve as variables by only considering variables that fall within the band-limit determined by the system optical condition such as the NA, wavelength, and source extent. The present invention iterates nonlinear optimization executed in the optimizer 120 by using variables in the pupil domain expression while allowing given amounts of negative excursions in the object domain expression which is found after iFT and subject to constraint conditions during the nonlinear optimization.

When the optimizer 120 determines the optimal mask pattern, the optical domain mask pattern is sent to the Wavefront Engineering (WE) module 130 to convert the optimized optical domain mask to a bitmap mask in the object domain whose transmission values are restricted to the allowed discrete values such as 0 and 1 that are supported by the mask blank specification, and thence to a polygon domain mask in which the edges of the mask polygons correspond to those edges in the bitmap mask where pixels transition between different supported transmission values.

The polygon domain joint optimizer 140 generally executes a local nonlinear program of the mask and the source to optimize the features of the source and the mask in the polygon domain. The polygon domain joint optimizer 140 is referred hereafter as SDJO 140 for simplifying the description. The present invention does not address the processing of the interface 110, the pre calculator 121, the global source optimizer 123, the WE module 130 and the SDJO 140, and so detailed description of the interface 110, the WE module and the SDJO 140 will be omitted herein. Examples of global source optimizers are described in U.S. Pat. No. 7,057,709, and examples of WE modules are described in U.S. Pat. No. 8,108,802.

The present process of the optimization uses the negative excursion in the object domain expression as the constraint condition. The optimization process usually adopts nonlinear optimizations in some steps in order to minimize the value of an object function under the constraint condition allowing the negative excursions in the object domain in the optimizer 120 illustrated in FIG. 1 as the best mode; however, the nonlinear optimization process can be executed in any other constructions so far as the constraint condition of the present invention is at least included in the course of the optimization as well as other known constraints.

For example, optimization 120 can use object domain variables rather than pupil domain variables. Constraints allowing negative excursions can be applied directly to the object domain variables in this case, but it is preferable to apply these constraints to the band-limited component of the object domain amplitude. This can be done by first propagating the object domain wavefront to the pupil plane by Fourier-transform, filtering the resulting pupil plane spatial frequencies according to the lens band-limit, and then iFTing back to the object plane to obtain the band-limited component of the object domain amplitude, to which negative excursion constraints can be applied. Unless optimization 120 uses full object domain variables, the net effect of these operations includes generating a band-limited pupil domain expression of the mask wavefront using mask variables that are initialized from mask patterns that can be provided by a step of global mask optimization, and the mask patterns from global mask optimization will in turn be initiated from the design patterns. Alternatively, the mask variables in the joint optimization can be directly initialized from the design patterns.

The nonlinear optimization step can be accomplished using standard methods, such as those that are described in the textbooks "Numerical Optimization" (Springer, 2006) by J. Nocedal and S. J. Wright, and "Nonlinear Programming" (Athena Scientific, 1995), by D. P. Bertsekas. Code modules adopting such nonlinear optimization methods are widely available, such as for example the Ipopt solver from the COIN organization. In a preferred embodiment, the nonlinear optimizer initializes the mask variables with the output of mask optimizer 122 and the source variables from the output of source optimizer 123, and then jointly adjusts these variables to maximize the value of a lithographic objective such as process window while maintaining constraints, including constraints on negative excursion of the band-limited component of the object domain amplitude.

FIG. 2 shows the schematic data processing of the optimizer 120, especially 122 and 124, with referring to the conventional process. Referring to FIG. 2, part (a) and part (c) show the conventional data processing, while part (b) and part (d) show the present data processing including FT and iFT processes. Parts (a) and (b) show 1-dimensional object domain mask. 202 and 205 show actual continuous mask shapes and 201 and 204 show sampled pixelated mask shapes. Parts (c) and (d) show pupil domain mask and the center vertical line means 0-th diffraction order values. The conventional ILT uses a pixelated mask in the object domain as variables during optimization as shown in part (a) of FIG. 2. The sampling points 201 are usually chosen densely so as to precisely represent in the object domain 202 the ideal sharp-edged feature that can be present in a manufacturable polygon domain mask. In addition, the amplitude 207 of each pixelated mask complies perfectly with the given transmission specification of the mask blank that the polygon features can be written in, for example as polygonal apertures in a film.

In conventional ILT this verisimilitude in matching the pixelated mask transmission to the specified mask blank transmission is considered natural, as is the use of a relatively high pixel density to allow the pixelated mask to better approximate the transmission profile of a sharp-edged polygonal aperture whose edge positions can be chosen on an essentially continuous basis, and whose edge positions can be adjusted as continuous variables during polygon domain optimization. The quality of the final polygon domain mask improves if the pixel density in the precursor optical domain mask is made large enough, but a relatively large number of pixel variables must then be employed, slowing computation speed.

As a more specific example, a simple bi-tone mask has 0 or 1 mask transmission and so the conventional ILT can limit the amplitude 207 to [0, 1]. The pupil domain mask representative can be calculated by applying Fourier-transformation, as shown in part (c) of FIG. 2, and the pupil domain mask 203 has higher frequency order than the optical system band-limit 208 relating to a numeral aperture NA, which is defined by the given exposure system including optical lens and allowed source directions.

On the other hand, in a preferred embodiment the present optimization process uses pupil domain mask variables during optimization as shown in FIG. 2 part (d). Then the pupil domain mask can be reduced to the optical system band-limit 208 and the number of variables can be minimized so as to reduce the computational overhead. The coarseness in the sampling can become 5 times coarser than that of the conventional process, providing a significantly faster computational speed. Despite this coarseness, the invention can provide higher quality solutions than the conventional ILT method, as will shortly be discussed.

Moreover, the invention can still employ a relatively coarse sampling when object plane mask variables are used during the FDJO step, for example about 4 times coarser than in the conventional ILT process. In this case the lower limit on the variable density that the invention can use is set by the requirement that the sampling along each axis must be finer than the Nyquist limit, and by the fact that the shape of the mask field will typically be rectangular in order to support the use of fast Fourier-transforms, whereas the optical band-limit will typically be circular, corresponding to the combined circular apertures of the pupils of the projection and illuminator lenses.

Regardless of whether pupil domain or object domain variables are used, the single-axis count of variables will be approximately the same if measured across the width of the band-limiting pupil diameter or across the width of the mask field, respectively. However, as a matter of geometry the total count of variables within the circular area of the pupil band-limit will be smaller in the former case than the total count of variables in the rectangular mask area in the latter case. Nonetheless, in all preferred embodiments the invention enjoys a variable count that is considerably smaller than the variable count employed by conventional ILT.

To avoid sacrificing solution quality when employing such a low variable count, the optical domain masks provided by the invention must remain capable of producing substantially the same high quality lithographic images as does the initially unknown optimal polygon domain mask that represents the best possible manufacturable mask. Though the specific design of this optimal or ideal polygon domain mask is of course not known before the full optimization flow is completed, it can be presumed that this optimal polygon mask will comprise apertures in a mask blank such that the transmission will make very sharp transitions between a plurality of supported values, such as between 0 outside the polygons, and 1 inside the polygons, while holding constant at one of these supported values between the sharp edges.

In addition, it can also be inferred that the sharp-edged wavefront pattern which can transmit through the apertures of the optimal polygon mask can not be entirely propagated through the projection lens to the wafer. Instead, the sharp polygon edges can cause portions of the light to diffract outside the collection band-limit of the projection lens. With partially coherent illumination it is not the case that even the entire band-limited component of the object domain wavefront will be propagated to the wafer, but it remains true that no part of the object domain wavefront which is not contained in the band-limited component will propagate to the wafer.

This means that if the ideal object domain wavefront that can be transmitted by the ideal polygon mask were somehow replaced by its own band-limited component, exactly the same optimal image can be produced on the wafer, because the object domain components outside the band-limit can in any case not be collected by the lens. This optimal image quality can be achieved by the band-limited component even though the band-limited component can be blurry and less sharply defined than the full object domain wavefront, due to the blurring that the band-limiting filter imposes.

The present invention shows that image quality is retained because the band-limited component undergoes negative excursions near feature edges which make the total swing in transmission at these edges larger, thereby compensating the blurrier definition that these band-limited edges exhibit. If the optimal polygon mask were known, the band-limited component can be found by filtering its object domain transmission profile. The sharp edges in the polygon transmission profile can be represented in the band-limited component by smoother and less sharp transitions, but these band-limited transitions can exhibit a compensating negative excursion that can increase the magnitude of the edge swing.

These negative excursions are reminiscent of the so-called Gibbs phenomenon in Fourier theory. Since the optimal mask is not known, the present invention allows the band-limited component of the solution to exhibit a negative excursion that is consistent with the general character of a Gibbs-like excursion, which then allows the optimizer to create a good approximation to the band-limited component of the ideal polygon mask, even though the variable count need only match the low resolution of the band-limited component, thereby allowing fast optimization.

More specifically, the present optimizer 120 allows the negative excursions 206 of the amplitude in relation to the feature of the mask in the object domain to be as large as the predetermined threshold. The FDJO solution produced by the optimizer is then a good approximation to the band-limited component of the ideal polygon mask. The consequence of any residual imperfection in the approximation is that it can not be possible to find a manufacturable polygon mask which exactly reproduces the optimized FDJO wavefront in a completely precise way.

However, the techniques disclosed in U.S. Pat. No. 8,108, 802 allow a polygon mask to be found which reproduces the optimal wavefront as closely as possible. These techniques are employed by module 130 to produce an initial polygon mask, and are referred to as wavefront engineering. A polygon domain optimization subsequent to the wavefront engineering step can then incorporate the techniques of U.S. patent application Ser. No. 12/334,488 to enforce manufacturability in the polygon mask design, with minimal loss in image quality.

The present invention positively uses expected negative excursions as a low resolution substitute for conventional high resolution edges of the object domain. Here, excessively large negative excursions can sometimes result in features whose physical infeasibility can be too large for wavefront engineering to compensate, so that the present invention limits the amounts of the negative excursions to be smaller than the predetermined threshold. The amounts of the negative excursions are expected to be larger around the mask feature than in other regions, and hence, the present invention particularly sets the threshold for dark points according to distances from the mask feature.

The term "dark premier points" can be defined to be the points that are present within predetermined distances from the feature edges, and that are exterior to bright regions. In the present invention, the term "dark interior point" means a point which is also exterior to bright regions of the target design and that has larger distance from the feature edges than the distance of the dark premier point. According to the present invention, the optimizer 120 prevents the negative excursions at the dark premier points from becoming smaller than the threshold, and optionally prevents the negative excursions at dark interior points from becoming smaller than a second threshold, which is usually larger (i.e. less negative) than the first threshold. As a further option, excursion limits that are even more stringent can be placed on those points in dark regions that are even more distant from the feature edges than the dark interior points. In general, it is preferable that the constraints at all dark evaluation points be at least as stringent as the constraints at dark premier points.

Figure 3:
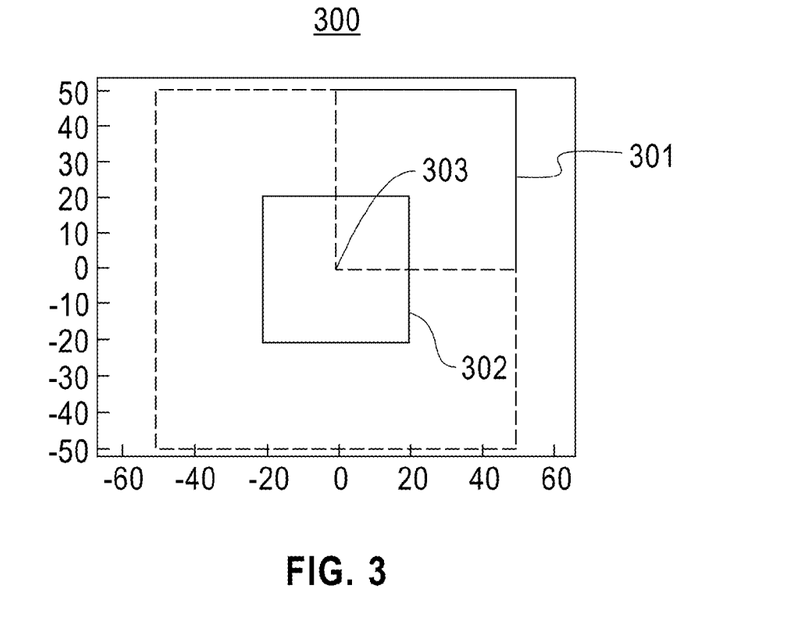
FIG. 3 shows the processing of the present invention for an illustrative example.
Figure 4:
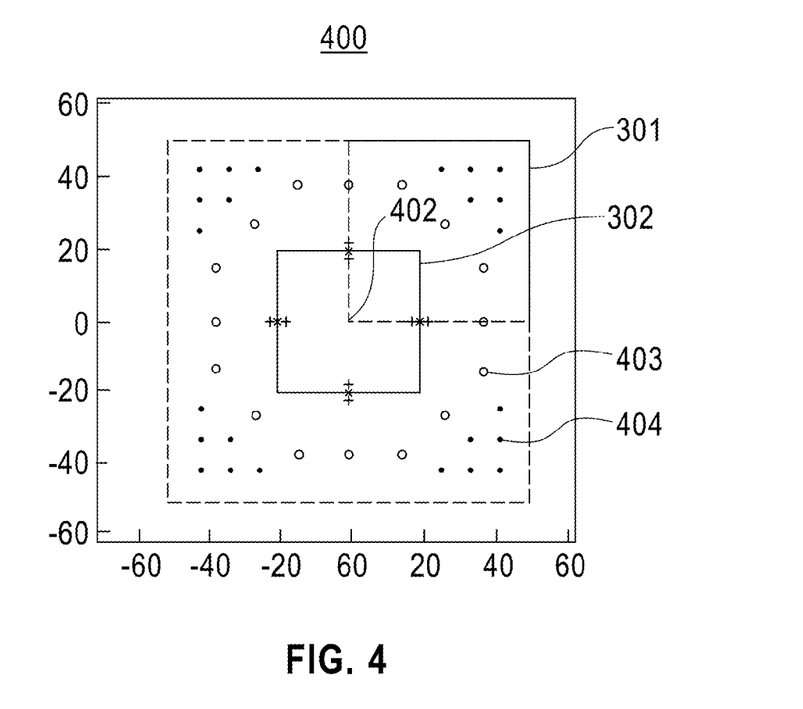
FIG. 4 shows an example of sampling points to be used in the present optimization.
Figure 5A:
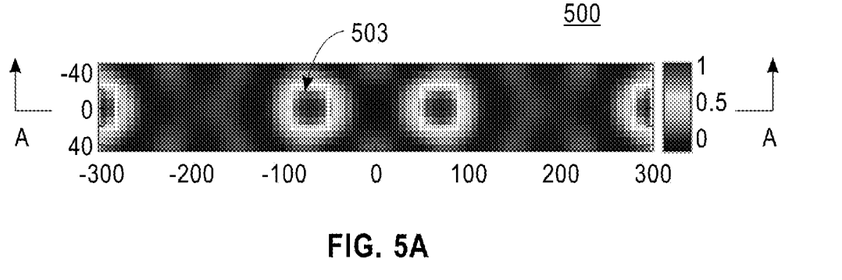
FIG. 5 shows a typical result for the band-limited component of the optimization in the object domain.
Figure 5B:
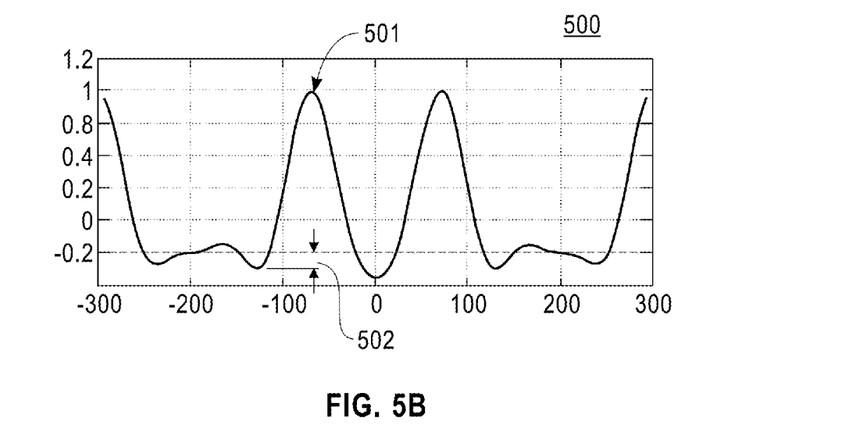

Referring to FIGS. 3, 4, and 5, basic constraints used in the FDJO 124, which is implemented with nonlinear optimizers, will be described in detail. Referring to FIG. 3, the processing of the present invention will be explained using illustrative example 300. The example 300 includes a bright target design 302 with the size of 40 nm×40 nm in the dark back ground area 301 of 100 nm×100 nm.

FIG. 4 shows the example 400 of evaluation points to be used in the present optimization. It can be noted that the evaluation points depicted in FIG. 4 correspond to the evaluation points in the object domain after iFT of the pupil domain. In the area 301, the light point 402, the dark premier point 403, and the dark interior point 404 are shown. Here, the term "bright point" means an evaluation point within the bright region of the target design; the term "dark premier point" 403 can be defined as the dark point placed within the dark region of the target design at a predetermined short distance from the feature edges 302. In the example 400, 17.5 nm is used for the predetermined distance from the edges 302 and dark premier point 403. The distance between dark interior point 404 is set to 8 nm here. The present invention defines the evaluation points on the area 301 as described above.

The basic constraints used in the present invention can be formulated as follows: a diffraction-order mask variable (vector) "a" in the pupil domain can be determined depending on particular system conditions using the size of the area 301 and optical parameters such as a exposure wavelength, e.g., 193.37 nm, a Numerical Aperture (NA) value, e.g., 1.35, an allowed illumination ratio of the NA, e.g. 1, and an immersion refractive index, e.g., 1.436. In the described embodiments, the mask variable "a" for illustrative example 300 contains three (3) diffraction-order elements as provided below considering symmetry, namely the diffraction orders:

[Formula 1]

$$(m_j, n_j) = (0,0), (1,0), (0,1) \tag{1}$$

where $m_j$ and $n_j$ are Fourier orders of the modulation of the mask. The diffract ion-order mask variables (vector) "a" can be denoted as follows in this example:

[Formula 2]

$$a = \begin{pmatrix} a_1 \\ a_2 \\ a_3 \end{pmatrix} \tag{2}$$

Coefficients of inverse Fourier-transformation to $a_j$ (j=1,2, 3) at arbitrary positions (x, y) in the area 301 can be formulated using the orders $m_j$ and $n_j$ as follows:

[Formula 3]

$$C_j = \exp\left\{2\pi \cdot i \cdot \left(\frac{m_j x}{P_x} + \frac{n_j y}{P_y}\right)\right\} \quad (3)$$

where "i" is an imaginary unit, $P_x$ and $P_y$ are sizes of the area in X-direction and Y-direction; in the described embodiment, $P_x = P_y = 100$, and $(m_j, n_j)$ is provided by the formula (1).

Then, the coefficient vector at the position (x, y) is as follows:

[Formula 4]

$$C_{(x,y)} = \begin{bmatrix} \exp\left\{2\pi \cdot i \cdot \left(\frac{m_1 x}{P_x} + \frac{n_1 y}{P_y}\right)\right\}, \\ \exp\left\{2\pi \cdot i \cdot \left(\frac{m_2 x}{P_x} + \frac{n_2 y}{P_y}\right)\right\}, \\ \exp\left\{2\pi \cdot i \cdot \left(\frac{m_3 x}{P_x} + \frac{n_3 y}{P_y}\right)\right\}, \end{bmatrix} \quad (4)$$

Transparency of the band-limited component of the object domain mask at the position (x, y) can be calculated by multiplying the mask variable "a" by respective iFT coefficients and summing the products.

Hereinafter, formulations under the present embodiment are described using the above definitions. The transmittances of the mask at the evaluation points are as follows:

[Formula 5]

$$C_{dp} \cdot a$$

$$C_{di} \cdot a$$

$$C_b \cdot a \quad (5)$$

where $C_{dp}$ represents the iFT coefficient vector at a dark premier point; $C_{di}$ represents the iFT coefficient vector at a dark interior point; $C_b$ represents the iFT coefficient vector at a bright point.

The bright points, or a designated portion of the bright points, are chosen as reference bright points. Often, every bright point is used as a reference bright point, as is done in this example, but as an option any bright points that are close to the exterior of a bright region can be excluded from the set of reference bright points. The iFT coefficient vector of the set of reference bright points is designated C<SUB>r</SUB>, and the transmittance of the mask at the reference bright points is $C_r \cdot a$.

An average transmittance of the reference bright points is calculated as follows:

[Formula 6]

$$\frac{1}{L} \cdot \sum_{r=1}^{L} (C_r \cdot a) \quad (6)$$

where L is the total number of the reference bright points. When the thresholds for the undershoots, i.e., amounts of the negative excursions at the dark premier point and the dark interior points are provided by $t_{dp}$ and $t_{di}$ respectively, the transmittance-based constraint condition in the preferred embodiment is formulated as follows:

[Formula 7]

$$\begin{cases} C_{dp} \cdot a \geq \frac{t_{dp}}{L} \cdot \sum_{r=1}^{L}(C_r \cdot a) & \forall\, dp \\ C_{di} \cdot a \geq \frac{t_{di}}{L} \cdot \sum_{r=1}^{L}(C_r \cdot a) & \forall\, di \\ C_r \cdot a \geq \frac{t_l}{L} \cdot \sum_{r=1}^{L}(C_r \cdot a) & \forall\, r \\ C_r \cdot a \geq 0 & \forall\, r \end{cases} \quad (7)$$

The positions of the evaluation points of the mask in the object domain shown in FIG. 4 are fixed and the coefficient vectors can be fixed during the process of the optimization, so that the constraint condition provided by formula (7) becomes a linear condition.

The evaluation points of spatial mask transmission, 402, 403 and 404 in FIG. 4, can be calculated at the pre-calculation step 121 and formula (7) becomes a linear condition on the mask variables during optimization. The present FDJO 124 solves nonlinear programming problems which can be generally formulated as follows:

[Formula 8]

$$\min f(x) x \in R^n$$

$$s.t.\ g^L \leq g(x) \leq g^U \quad (8)$$

where x are the optimization variables, f(x) in (8) is the objective function, and g(x) is the general nonlinear constraints. The present FDJO 124 uses formula (7) as a part of constraints g(x) in (8), and can, for example, use process window as the objective f(x). In the present preferred embodiment, the constraints g(x) can include the constraints limiting the negative excursions. The typical values of the limits of the negative excursions $t_{dp}$ and $t_{di}$ are −0.15 and −0.10, respectively, for masks of the typical binary kind. However, these values are only examples and the threshold values can be determined depending on particular applications. The global mask optimizer 122 also uses formula (7) as a part of constraints, just as FDJO 124 does.

FIG. 5 shows an example band-limited mask component 500 in the object domain after iFT. In FIG. 5 part (a), the band-limited transmittance distribution of the object domain is shown; the rectangular outlines represent the shapes of the target design. The highlight region 503 in the rectangle indicates the highest transmittance region. FIG. 5 part (b) shows sectional transmittance distribution along the line A-A of FIG. 5 part (a) and the ordinate represents the transmittance from 0 to 1 and the abscissa represents the position in the object domain. As shown in FIG. 5, the highest transmittance is indicated by the reference sign 501 and the negative excursion 502 around the bottom of the transmittance curve profile is allowed in the optimization according to the present invention and the transmittance distribution can be acceptable in the object domain expression.

Figure 6A:
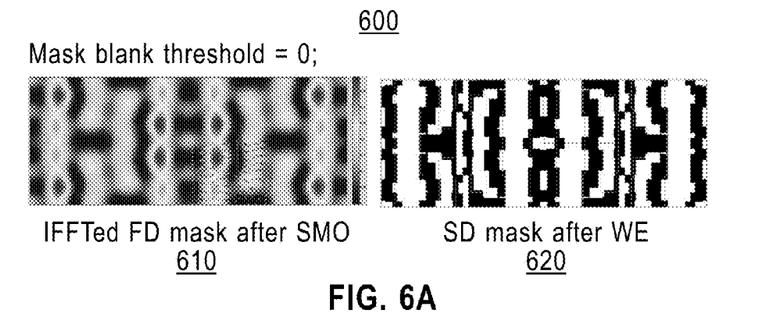
FIG. 6 shows the SMO results when changing the threshold for the dark premier point to be $t_{dp}$=0 (a), and $t_{dp}$=−0.15, (b) while other conditions were kept identical.
Figure 6B:
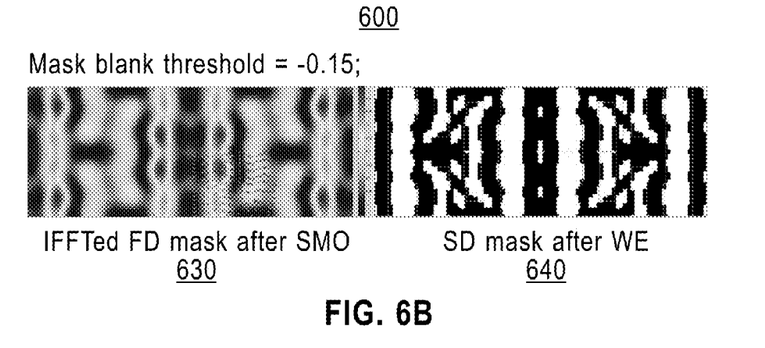

FIG. 6 shows the SMO results when changing the threshold for the dark premier point to be $t_{dp}=0$ (a) and $t_{dp}=-0.15$ (b) while other conditions were kept identical. In FIG. 6, the results of SMO and the polygon domain mask patterns after WE processing. In FIG. 6, parts (a) and (b), the left hand profiles 610, 630 are the results of FDJO and the right hand patterns are the patterns of SD masks.

Referring again to FIG. 6, global profiles of the SMO results are almost same and the profile 630 allowing the negative excursion to be −0.15 provides physically acceptable SD mask pattern 640. As shown in FIG. 6, the SMO optimization is relatively robust to the limited negative excursion while reducing the number of sampling points and the iteration cycle numbers during the optimization.

Figure 7:
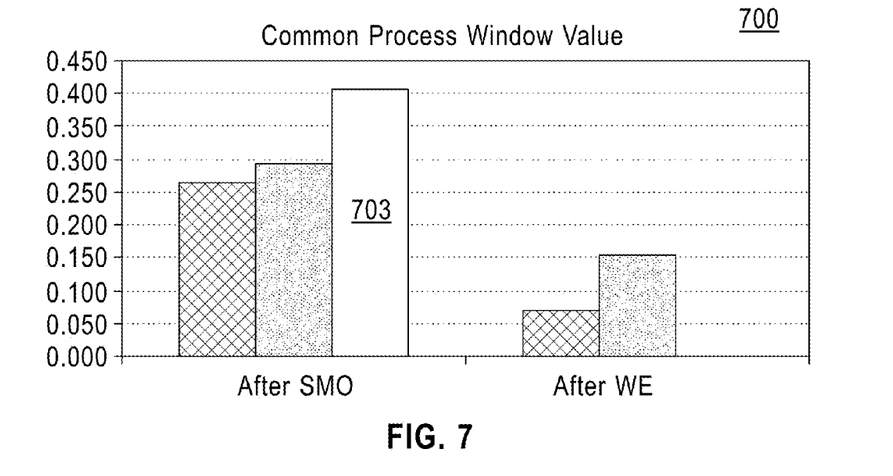
FIG. 7 shows improvements in common process window values by simulation with respect to the negative excursions in the object domain.

FIG. 7 shows improvements in common process window values by simulation with respect to the negative excursions in the object domain. The bar 701 ($t_{dp}$=0), 702 ($t_{dp}$=−0.15), and the bar 703 (threshold disabled) show the results after SMO and the bar 704 ($t_{dp}$=0) and the bar 705 ($t_{dp}$=−0.15) are the result after WE.

The process window value is improved by 11% for the negative excursion of $t_{dp}$=−0.15 to the reference of $t_{dp}$=0. When the negative excursions are not limited at all as shown by the bar 703, the common process window value is nominally improved by about 50%; however, physically acceptable mask patterns are not obtained after WE processing in this case, since the mask blank technology cannot reproduce such a solution using manufacturable patterns. From FIG. 7, the limitation of the negative excursions to a predetermined level can improve SMO optimization process while improving the common process window value.

Figure 8A:
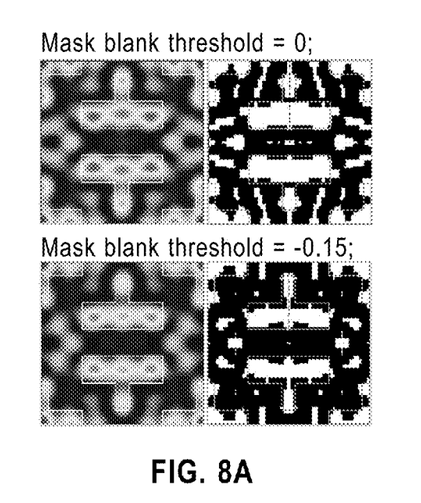
FIG. 8 shows other examples of the present invention when the present invention is applied to different target designs.
Figure 8B:
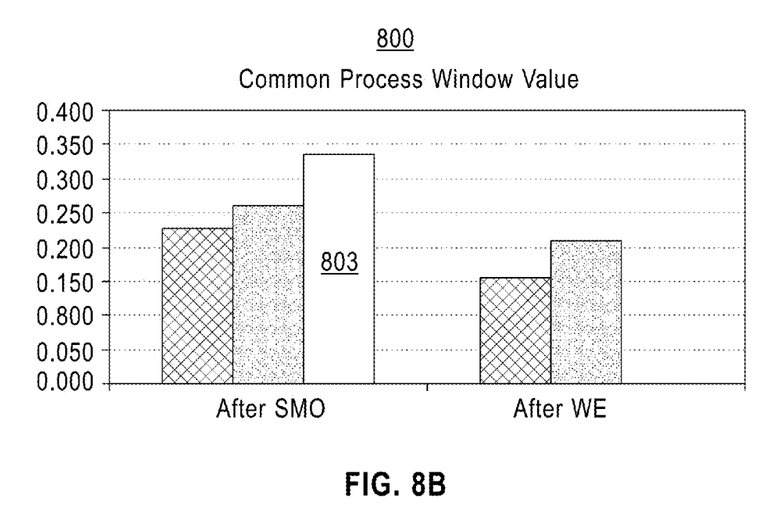
Figure 9A:
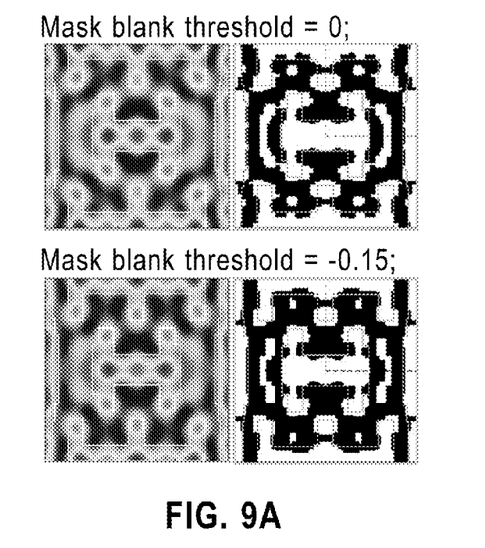
FIG. 9 shows another example of the present invention.
Figure 9B:
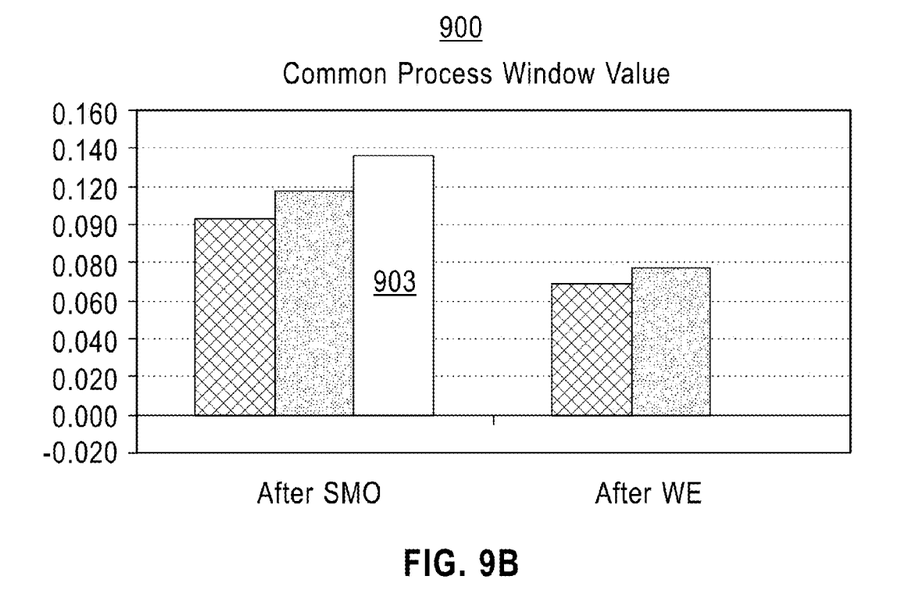

Both FIG. 8 and FIG. 9 show examples of the present invention when the present invention is applied to another target design. FIG. 8 part (a) shows SMO profiles and mask patterns for $t_{dp}$=0 and $t_{dp}$=−0.15, respectively. FIG. 8 part (b) shows the common process window values simulated. The lines in FIG. 8 part (a) indicate the target designs. As shown in FIG. 8 part (a), the limited negative excursion value allows reproduction of the target designs when compared to the pattern of zero negative excursion. In turn, referring to FIG. 8 part (b), the process window value of the bar 802 ($t_{dp}$=−0.15) is improved about 15% compared to the process window value of no negative excursion shown by the bar 801. The improvement is yet improved after WE processing by 34%. In this example, the threshold disabled case shown by the bar 803 shows much improvement in the process window; however, the threshold disable case can not form physically acceptable patterns in this example. FIG. 9 shows another example of the present invention and the results similar to examples described in FIG. 6 and FIG. 8 are obtained. In the example shown in FIG. 9, the improvement in the process window is about 14% after SMO and is 10% after WE processing; however, the threshold disable case fails in forming physically acceptable mask patterns as described in FIGS. 6 and 8.

The threshold value can be adequately determined depending in particular on the transmission values supported by the mask blank technology, but adjustments to the threshold value can optionally be considered when lens resolution or ground rules are changed. The inventors have confirmed that $t_{dp}$ values of −0.15 and −0.20 are suitable with typical binary mask blanks, where the supported transmissions are approximately 0 and 1; however, these values can suggest possible values for the particular embodiment and the value of the negative excursion can be determined depending on particular applications.

The present invention has been described with reference to the embodiments shown in the drawings. However, the present invention is not limited to the embodiments shown in the drawings and various changes or other embodiments can be possible which are derived by a person skilled in the art, the true scope of the present invention can be determined by appended claims.

The invention claimed is:

1. A method for manufacturing a mask comprising the steps of:
   generating an optical domain representation from a design pattern and an imaging light; and
   optimizing said optical domain representation under a constraint that values of negative excursions at predetermined evaluation points must be greater than or equal to predetermined negative threshold values assigned to said predetermined evaluation points;
   wherein:
   said optical domain representation is a variable representation of a wavefront;
   said imaging light is light that is transmitted through said mask;
   said negative excursions are in an object domain representation of said optical domain representation;
   said predetermined evaluation points are in said object domain representation;
   said predetermined negative threshold values are determined as a function of distances from a feature edge of said mask;
   outside of the feature, said function specifies that a negative threshold value for a first distance is smaller than a negative threshold value for a second distance that is larger than the first distance; and
   at least one of the steps is carried out by a computing device.

2. The method according to claim 1, wherein said optical domain representation is a pupil domain representation that is band-limited.

3. The method according to claim 1, wherein:
   said optical domain representation is an object domain representation; and
   said constraint is applied to a band-limited component of said optical domain representation.

4. The method according to claim 3, wherein:
   said constraint is applied to an object domain representation of said optical domain representation; and
   said object domain representation is band-limited using a filter.

5. The method according to claim 1, wherein:
   said optical domain representation is an object domain representation; and
   said constraint is applied to non-limited amplitudes of said object domain representation.

6. The method according to claim 1, wherein said negative threshold values are assigned to said evaluation points based on distances from a center of a local design pattern.

7. The method according to claim 1, wherein said predetermined evaluation points provide a linear constraint during the optimization.

8. The method according to claim 1, comprising a step of:
   filtering a pupil domain representation of said wavefront with a circular band-limit.

9. A non-transitory article of manufacture tangibly embodying computer readable instructions which, when implemented, cause a computer device to carry out a method for designing a mask, the method comprising the steps of:
   generating an optical domain representation from a design pattern and an imaging light; and
   optimizing said optical domain representation under a constraint that values of negative excursions at predetermined evaluation points be greater than or equal to predetermined negative threshold values assigned to said predetermined evaluation points;

wherein:
said optical domain representation is a variable representation of a wavefront;
said imaging light is light that is transmitted through said mask;
said negative excursions are in an object domain representation of said optical domain representation;
said predetermined evaluation points are in said object domain representation;
said predetermined negative threshold values are determined as a function of distances from a feature edge of said mask; and
outside of the feature, said function specifies that a negative threshold value for a first distance is smaller than a negative threshold value for a second distance that is larger than the first distance.

10. The article of manufacture according to claim 9, wherein said optical domain representation is a pupil domain representation that is band-limited.

11. The article of manufacture according to claim 9, wherein
said optical domain representation is an object domain representation; and
said constraint is applied to a band-limited component of said optical domain representation.

12. The article of manufacture according to claim 9, wherein:
said constraint is applied to an object domain representation of said optical domain representation; and
said object domain representation is band-limited using a filter.

13. The article of manufacture according to claim 9, wherein:
said optical domain representation is an object domain representation; and
said constraint is applied to non-limited amplitudes of said object domain representation.

14. The article of manufacture according to claim 9, wherein said negative threshold values are assigned to said evaluation points based on distances from a center of a local design pattern.

15. The article of manufacture according to claim 9, wherein said optimization step is iterated by using variables in a pupil domain expression while allowing an amount of negative excursions in said object domain representation.

16. The article of manufacture according to claim 9, comprising a step of:
filtering a pupil domain representation of said wavefront with a circular band-limit.

17. A system for designing a mask, comprising:
a memory;
a processor device communicatively coupled to said memory;
a module for designing said mask, communicatively coupled to said memory and said processor device;
a generator for generating an optical domain representation of a wavefront from a design pattern and an imaging light; and
an optimizer for optimizing said optical domain representation under a constraint that values of negative excursions at predetermined evaluation points be greater than or equal to predetermined negative threshold values assigned to said predetermined evaluation points;
wherein:
said optical domain representation is a variable representation of a wavefront;
said imaging light is light that is transmitted through said mask;
said negative excursions are in an object domain representation of said optical domain representation;
said predetermined evaluation points are in said object domain representation;
said predetermined negative threshold values are determined as a function of distances from a feature edge of said mask; and
outside of the feature, said function specifies that a negative threshold value for a first distance is smaller than a negative threshold value for a second distance that is larger than the first distance.

18. The system according to claim 17, wherein said optical domain representation is pupil domain representation that is band-limited.

19. The system according to claim 17, wherein:
said optical domain representation is an object domain representation; and
said constraint is applied to a band-limited component of said optical domain representation.

20. The system according to claim 17, wherein:
said constraint is applied to an object domain representation of said optical domain representation; and
said object domain representation is band-limited using a filter.

* * * * *